(12) United States Patent
Saito (10) Patent No.: US 9,258,934 B2
(45) Date of Patent: Feb. 9, 2016

(54) IN-VEHICLE ELECTRONIC DEVICE AND VEHICLE HAVING THE ELECTRONIC DEVICE

(71) Applicant: Hitachi Automotive Systems, Ltd., Hitachinaka-shi, Ibaraki (JP)

(72) Inventor: Masashi Saito, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 0 days.

(21) Appl. No.: 14/404,391

(22) PCT Filed: Apr. 12, 2013

(86) PCT No.: PCT/JP2013/061011
§ 371 (c)(1),
(2) Date: Nov. 26, 2014

(87) PCT Pub. No.: WO2013/179785
PCT Pub. Date: Dec. 5, 2013

(65) Prior Publication Data
US 2015/0109747 A1    Apr. 23, 2015

(30) Foreign Application Priority Data

May 29, 2012 (JP) .................................. 2012-122011

(51) Int. Cl.
*H05K 9/00* (2006.01)
*B60R 16/023* (2006.01)
(Continued)

(52) U.S. Cl.
CPC .............. *H05K 9/0079* (2013.01); *B60R 16/02* (2013.01); *B60R 16/0239* (2013.01); *H02G 3/10* (2013.01); *H05K 5/0073* (2013.01); *H05K 9/0037* (2013.01); *H05K 9/0067* (2013.01)

(58) Field of Classification Search
CPC . H05K 9/0067; H05K 5/0073; H05K 1/0215; G06F 1/182

USPC ............................................................ 174/51
See application file for complete search history.

(56) References Cited

U.S. PATENT DOCUMENTS 4,092,698 A * 5/1978 Brefka ...................... G01R 1/04
                                                          361/622
4,667,266 A * 5/1987 Masuoka ............. H01H 13/702
                                                          361/212
(Continued)

FOREIGN PATENT DOCUMENTS

JP        5-41568 A    2/1993
JP        7-312264 A   11/1995
(Continued)

OTHER PUBLICATIONS

International Search Report dated Jun. 11, 2013 with English translation (Four (4) pages).

*Primary Examiner* — Adrian S Wilson
(74) *Attorney, Agent, or Firm* — Crowell & Moring LLP (57) ABSTRACT

An in-vehicle electronic device is provided which can ensure resistance to static electricity for the in-vehicle electronic device covered with a resin case, is more downsized smaller in the number of components, and inexpensive. An in-vehicle electronic device 43 includes: a resin housing (resin case) 5; a control board 7 that is covered with the housing, and accommodated within the housing a battery harness 27 that is a power wiring which supplies power to the control board; a signal harness 31 that is an input/output signal wiring that transmits an input/output signal to the control board; and a metal bracket 1 that fixes the resin housing to a vehicle main body. In the device, a distance between a projection 35 of the metal bracket 1 and the battery harness 27 is set to be shorter than a distance between the projection 25 of the metal bracket 1 and the signal harness 31 to form a discharge gap 33.

6 Claims, 7 Drawing Sheets

(51) Int. Cl.
*H02G 3/10* (2006.01)
*B60R 16/02* (2006.01)
*H05K 5/00* (2006.01)

(56) References Cited

U.S. PATENT DOCUMENTS

| | | | | |
|---|---|---|---|---|
| 5,206,783 A | * | 4/1993 | Mori | H05K 9/0067 361/212 |
| 5,206,796 A | * | 4/1993 | Thompson | H05K 9/002 174/359 |
| 5,418,693 A | * | 5/1995 | Perry | H05K 9/0067 361/748 |
| 5,594,204 A | * | 1/1997 | Taylor | G06F 13/409 174/354 |
| 7,646,598 B2 | * | 1/2010 | Hiratsuka | G06F 1/1632 174/354 |
| 8,520,397 B2 | * | 8/2013 | Azumi | H05K 5/0052 361/730 |
| 2006/0158858 A1 | * | 7/2006 | Wakabayashi | B41J 29/377 361/719 |
| 2009/0084587 A1 | | 4/2009 | Kishimoto | |
| 2009/0246047 A1 | * | 10/2009 | Hattori | H02K 11/0089 417/410.1 |
| 2009/0251843 A1 | | 10/2009 | Hironaka | |
| 2010/0253188 A1 | * | 10/2010 | Koyama | H05K 5/0073 312/223.1 |
| 2012/0026703 A1 | | 2/2012 | Nomoto | |
| 2012/0069532 A1 | * | 3/2012 | Azumi | H05K 5/0052 361/752 |

FOREIGN PATENT DOCUMENTS

| | | |
|---|---|---|
| JP | 2007-329003 A | 12/2007 |
| JP | 2009-88396 A | 4/2009 |
| JP | 2009-181983 A | 8/2009 |
| JP | 2012-28661 A | 2/2012 |

* cited by examiner

IN-VEHICLE ELECTRONIC DEVICE AND VEHICLE HAVING THE ELECTRONIC DEVICE

TECHNICAL FIELD

The present invention relates to an in-vehicle electronic device, for example, an in-vehicle electronic device covered with a resin case, and a vehicle having the electric device.

BACKGROUND ART

Up to now, as an in-vehicle electronic device of this type, and a vehicle having the electronic device, there is a configuration including a conductive housing, a control hoard accommodated in the housing, and a discharge gap that discharges when a high voltage of a given voltage or higher is applied between a conductive pattern formed on the control board and the housing, and further including a conductive plate that covers the control board, and is electrically connected to the conductive pattern, in which the discharge gap is formed between the conductive plate and the housing (for example, refer to Patent Literature 1).

CITATION LIST

Patent Literature

Patent Literature 1: Japanese unexamined Patent Application Publication No. 2007-329003

SUMMARY OF INVENTION

Technical Problem

Incidentally, the in-vehicle electronic device with the above structure requires the conductive housing or the conductive plate, and suffers from such a problem that the number of components increases as compared with a case structure made of only resin. Also, when an electric connection between the conductive housing and a body earth is not ensured by an anticorrosive coating of the body earth, a discharge path has the potential to be not ensured.

The present invention has been made in view of the above problem, and one object of the present invention is to provide an in-vehicle electronic device that can ensure resistance to static electricity for the in-vehicle electronic device covered with a resin case, is more downsized and smaller in the number of components, and inexpensive. Also, another object or the present invention is to provide a vehicle having the above in-vehicle electronic device.

Solution to Problem

In order to achieve the above objects, according to the present invention, there is provided an in-vehicle electronic device including; a resin housing; a control board that is covered with the housing, and accommodated within the housing; a power wiring that supplies power to the control board; an input/output signal wiring that transmits an input/output signal to the control board; and a metal bracket which fixes the resin housing to a vehicle main body, in which a distance between the metal bracket and the power wiring is set to be shorter than a distance between the metal bracket and the input/output signal wiring to form a discharge gap. One of the power wiring is connected to a vehicle GND or a negative electrode of the vehicle battery, and the other of the power wiring is connected to the positive electrode of the vehicle battery.

In the in-vehicle electronic device according to the present invention as configured as described above, when a static electricity is supplied to the metal bracket, the static electricity is discharged in a discharge gap portion which is short in a distance between the metal bracket and the power wiring, and can prevent discharge in a portion long in a distance between the metal bracket and the input/output signal wiring, and can prevent an influence caused by discharge to a semiconductor element mounted on the control board.

Advantageous Effects of Invention

According to the present invention, there can be provided the in-vehicle electronic device which can ensure resistance to static electricity for the in-vehicle electronic device covered with a resin case, is more downsized smaller in the number of components, and inexpensive.

DESCRIPTION OF EMBODIMENTS

Hereinafter, an in-vehicle electronic device according to an embodiment of the present invention will be described in detail with reference to the drawings. First, in a connection diagram of the in-vehicle electronic device in a vehicle illustrated in FIG. 1, an in-vehicle electronic device 43 receives an electric power necessary for realizing a function of the device from a vehicle battery 55. The in-vehicle electronic device 43 and the vehicle battery 55 are connected to respective positive electrodes and negative electrodes by a battery harness 27 and a GND harness 31. Also, the in-vehicle electronic device 43 is connected to a load device 49 to be controlled by a load connection line 45 and a load connection line 47. A control state of the load device 49 is detected by a sensor 53, and transmitted to the in-vehicle electronic device 43 through a signal harness 29. Further, vehicle velocity information is informed the in-vehicle electronic device 43 of from another electronic device 59 through another electronic device connection line 57.

Figure 2:
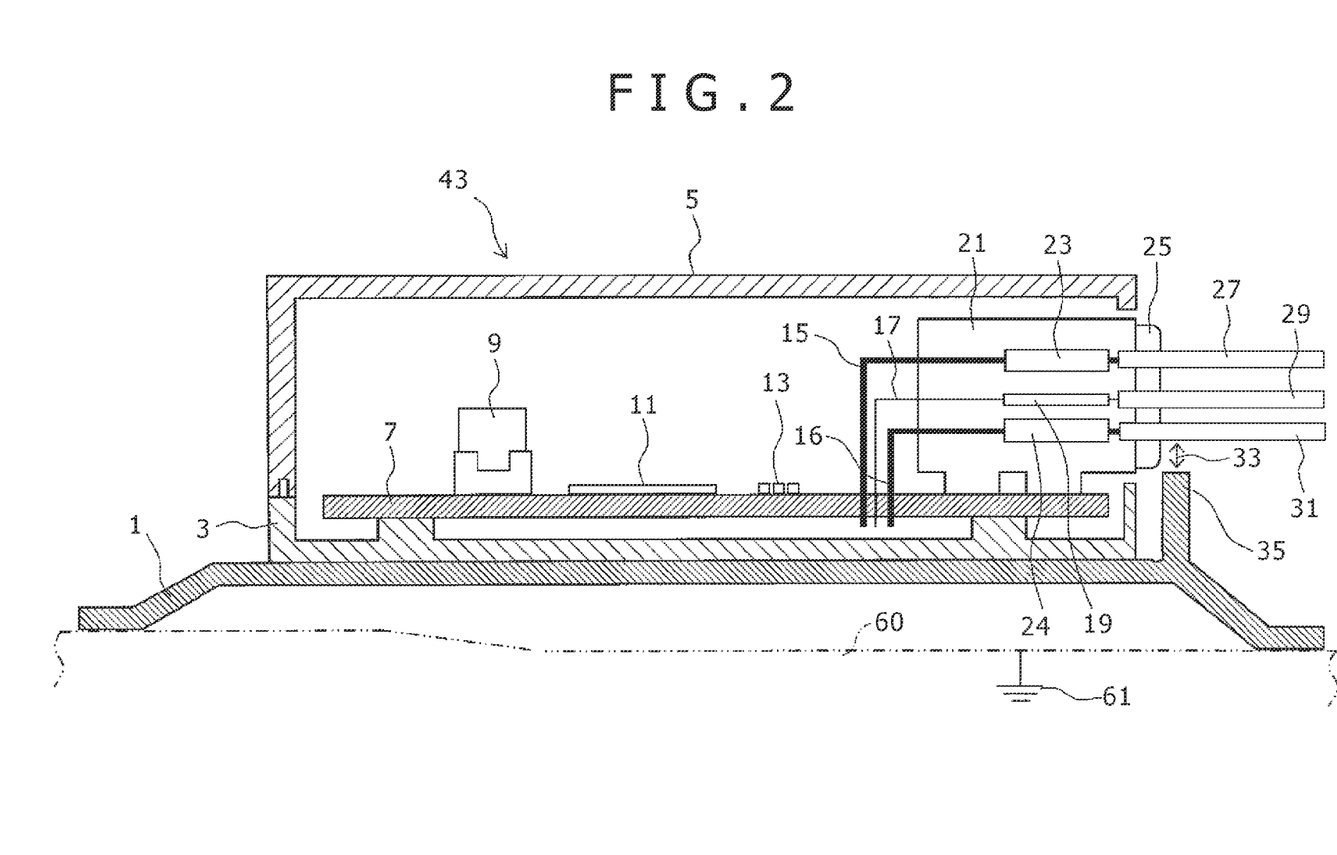
FIG. 2 is a cross-sectional view of the in-vehicle electronic device according to the present invention.
Figure 3:
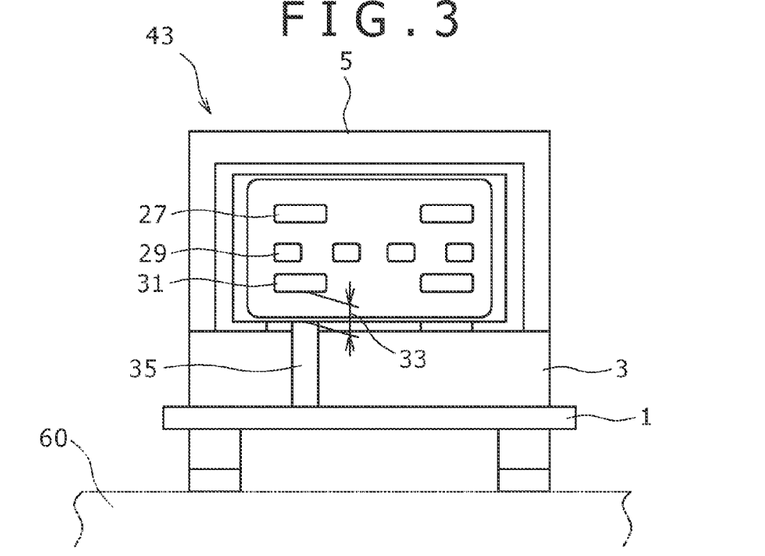
FIG. 3 is a front view of the in-vehicle electronic device according to the present invention.
Figure 4:
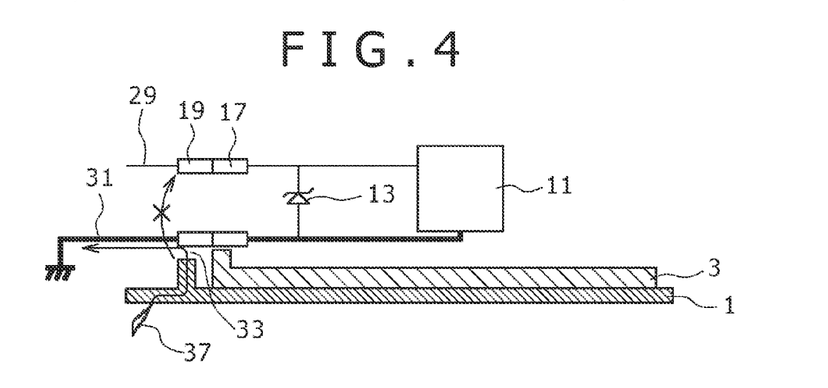
FIG. 4 is a diagram illustrating one example of an electrostatic discharge path in the in-vehicle electronic device according to the present invention.

In a cross-sectional view illustrating an internal configuration diagram of the in-vehicle electronic device 43 in FIG. 2, and a front view of FIG. 3, the battery harness 27 is electrically connected to a power connector terminal (female) 23, and further conducted to a control board 7 through a power connector terminal (male) 15. The GND harness 31 is electrically connected to a GND connector terminal (female) 24, and further conducted to the control board 7 through a GND connector terminal (male) 16. A signal harness 29 is electrically connected to a signal connector terminal (female) 19, and further conducted to the control board 7 through a signal connector terminal (female) 17. A control circuit is formed on the control board 7. The control circuit includes a capacitor 9, a semiconductor element 11, and a passive element 13.

For the purpose of holding the control circuit, and protecting the control circuit from adhering to a foreign matter, a resin case 3 and a resin housing 5 are arranged above and below the control circuit. The resin case 3 and the resin housing 5 are made of a resin material such as a PBT (polybutylene terephthalate polyphenylene sulfide phthalate) or PPS (polyphenylenesulfide), and have no conductivity. a metal bracket 1 is provided for the purpose of mechanically fitting the in-vehicle electronic device 43 to the vehicle, and the in-vehicle electronic device 43 and the vehicle are mechanically joined to each other through the metal bracket 1. Because the case material is an insulator the metal bracket 1 is electrically isolated from a GND pattern on the control board 7.

Figure 1:
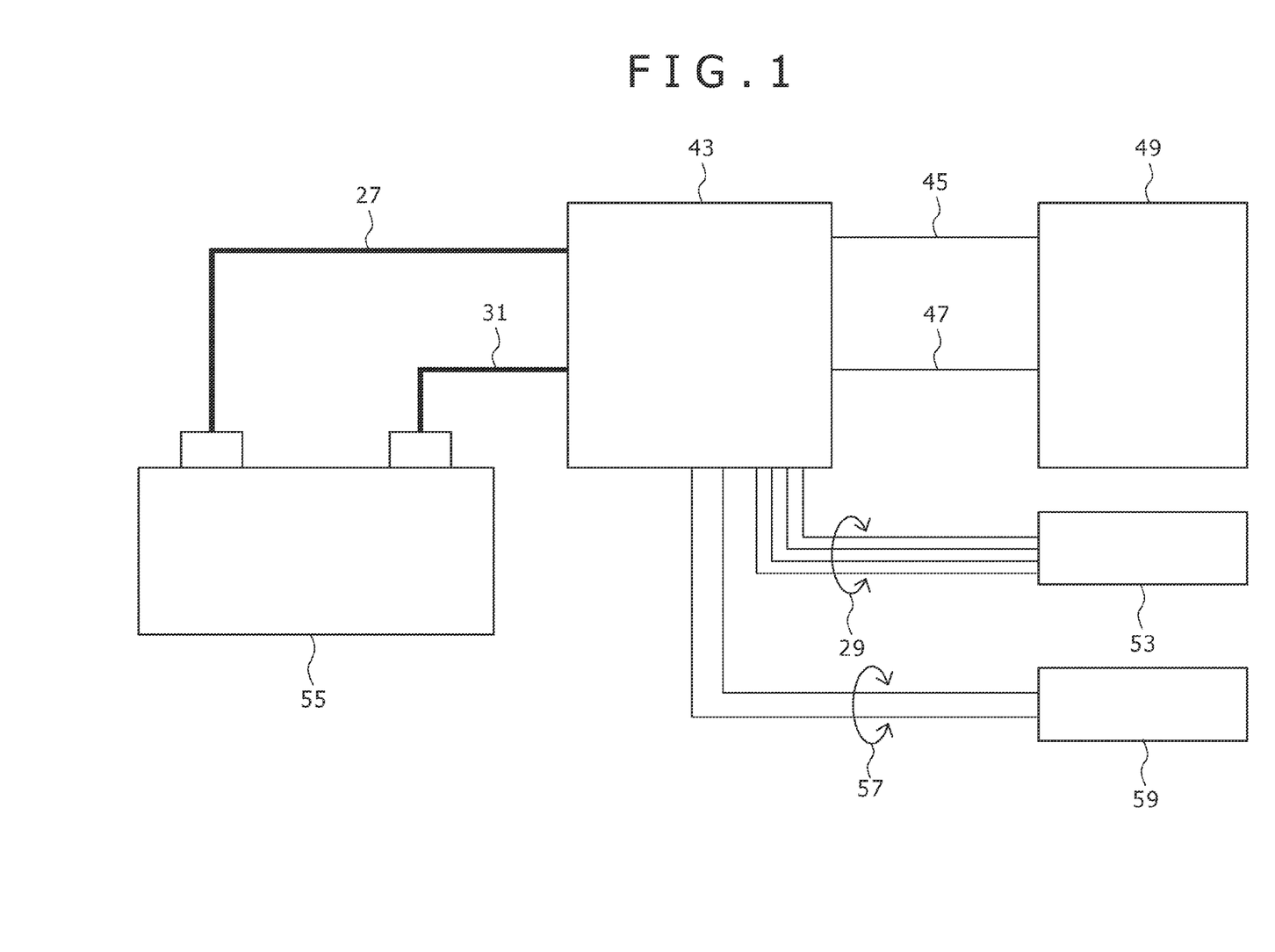
FIG. 1 is a block diagram illustrating a connection state of an in-vehicle electronic device according to the present invention.
Figure 5:
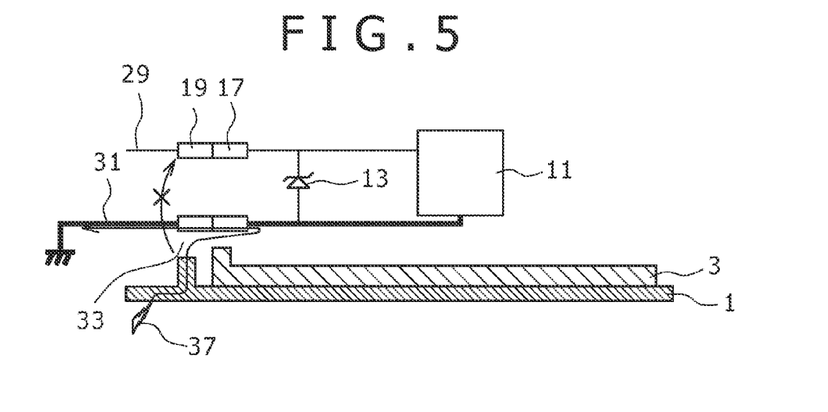
FIG. 5 is a diagram illustrating another example of an electrostatic discharge path in the in-vehicle electronic device according to the present invention.
Figure 6:
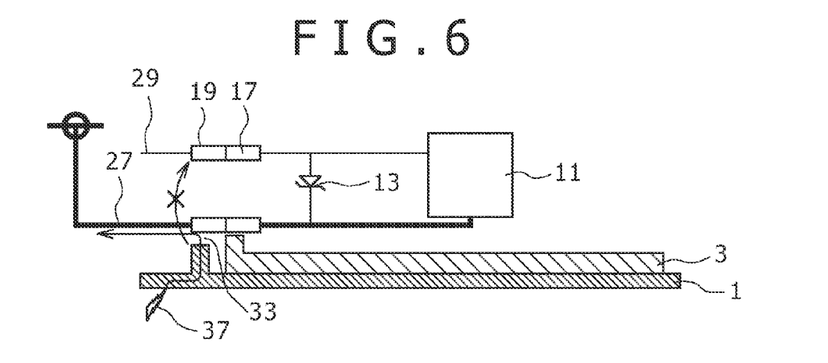
FIG. 6 is a diagram illustrating another example of an electrostatic discharge path in the in-vehicle electronic device according to the present invention.
Figure 7:
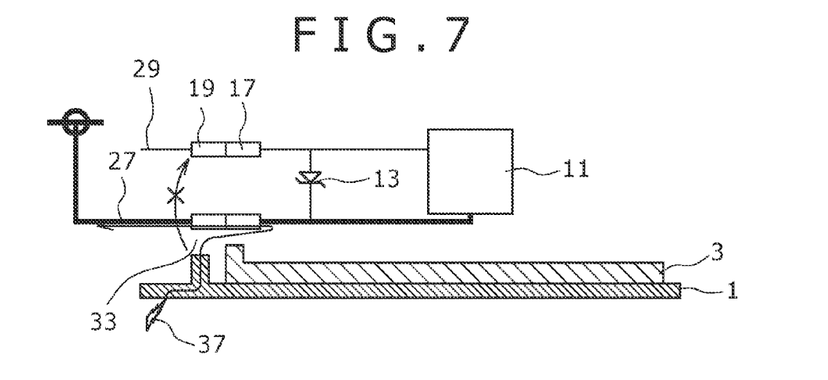
FIG. 7 is a diagram illustrating another example of an electrostatic discharge path in the in-vehicle electronic device according to the present invention.
Figure 8:
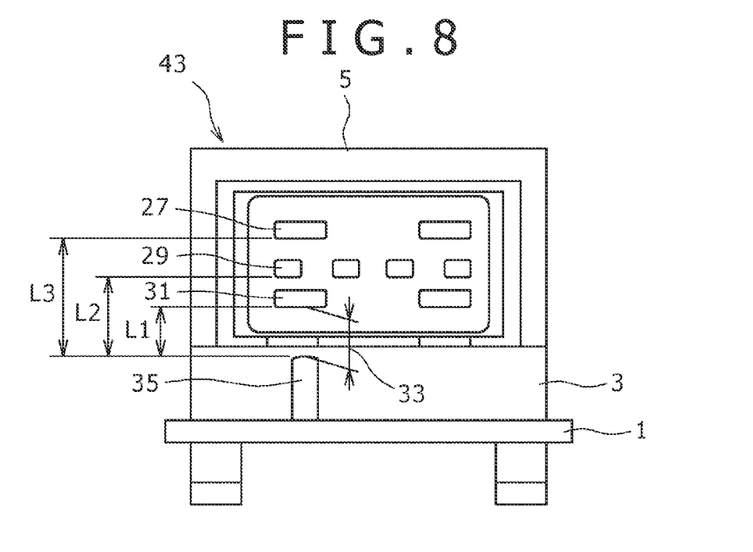
FIG. 8 is a layout diagram illustrating one example of a metal bracket projection and a harness in the in-vehicle electronic device according to the present invention.

A projection is projected from the metal bracket 1, and illustrated as a metal bracket projection 35 in FIGS. 1, 3, and 5. A short-distant discharge cap 33 is formed between the metal bracket projector 35 and the GND harness 31, and when static electricity supplied to the metal bracket 1 is discharged, the static electricity is discharged to the GND harness 31 through the discharge gap 33. Because the GND harness 31 is electrically connected to a vehicle GND 61 (vehicle main body 60) end grounded, a high voltage generated by application of static electricity is transmitted to the vehicle GND 61 through the GND harness 31 without being transmitted to the control board 7.

TABLE 1

| Applied Portion | Applied Voltage Level |
| --- | --- |
| Connector Terminal Part | ±several kV |
| Case Part, Housing Part | ±dozen kV to ±twenty several kv |

As a static electricity application level, Table 1 describes applied portions and voltage levels in a static electricity application test. Several kV (sign omitted) is applied to the connector terminal part, and dozen kV to twenty several kV (sign omitted) is applied to the case part and the housing part. It is conceivable that the generation of the static electricity is caused by allowing a worker or a driver who is charged with static electricity to touch equipment. In the test, an outer portion of the in-vehicle electronic device that can be touched directly by the worker or the driver during energization of the in-vehicle electronic device is applied with a higher voltage as compared with the connector terminal part of the in-vehicle electronic device 43. If there is no metal bracket projection, an applied voltage of dozen KV to twenty several KV (sign omitted) applied to the case part 3 and the housing part 5 is discharged to an arbitrary terminal of the connector terminal part 17. If the applied voltage is discharged to the signal connector terminal 17, the signal connector terminally, or the signal harness 29, there is a risk that the in-vehicle electronic device 43 is destroyed.

In a diagram of the in-vehicle electronic device 43 illustrated in FIG. 3 viewed from a connection direction, when distances between the metal bracket projection 35 formed on the metal bracket 1, and respective harnesses (GND harness 31, signal harness 29, battery harness 27) are compared with each other, a distance between the metal bracket projection 35 and the GND harness 31 is set to be shorter than distances between the metal bracket projection 35 and the other harnesses. In FIG. 3, the respective harnesses may be replaced with terminals.

In the static electricity applied portions and the discharge path diagrams illustrated in FIGS. 4 to 7, the applied portion assumed in this application is an arbitrary point on the metal bracket 1. A static electricity 37 applied to the arbitrary point of the metal bracket 1 is transmitted to the metal bracket projection 35, and discharged to the GND harness 31 shorter in the discharge distance through the discharge gap 33. For that reason, the transmission of a high voltage and a large current generated when the static electricity is supplied to the semiconductor element 11 mounted within the in-vehicle electronic device 43 can be prevented without being discharged to the signal harness 29 or the power connector terminal (female) 23 of the in-vehicle electronic device 43. Further, in FIGS. 6 and 7, the same advantages as those described above can be obtained even if the layouts of the connector terminals are changed to set the harness to be discharged to the battery harness 27.

In a relative position relationship diagram of the distances between the metal bracket projection 35 and the respective connecter terminals, it is found that the distance relationship is L1<L2<L3. In this example, L1, L2, and L3 represent the distance between the metal bracket projection 35 and the GND harness 31, the distance between the metal bracket projection 35 and the GND harness 29, and the distance between the metal bracket projection 35 and the battery harness 27, respectively. In this example, when the static electricity is charged to the resin housing 5 or the metal bracket 1, because the distance L4 is smaller than the distance L5, the static electricity is discharged in the discharge gap 33 having the distance L4 between the metal bracket projection 35 and the GND harness 31, and can be prevented from being discharged by the signal harness 29.

Figure 9:
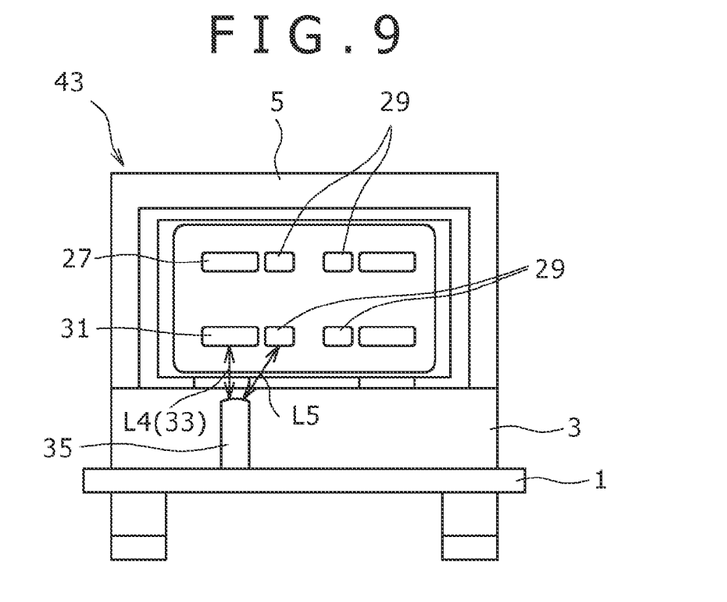
FIG. 9 is a layout diagram illustrating another example of a metal bracket projection and a harness in the in-vehicle electronic device according to the present invention.
Figure 10:
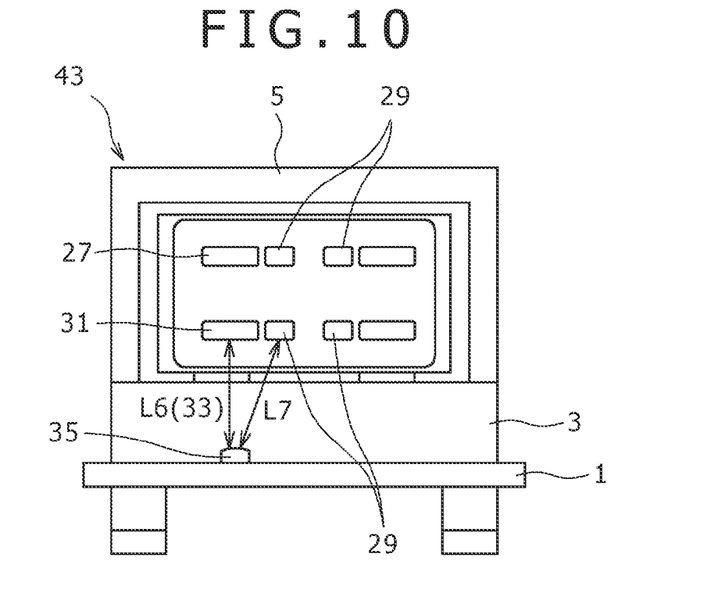
FIG. 10 is a layout diagram illustrating another example of a metal bracket projection and a harness in the in-vehicle electronic device according to the present invention.

In FIG. 10, as compared with FIG. 9, a position of the metal bracket projection 35 in a vertical direction is set to be different therebetween, but the positional relationship is L6<L7. In this example, L6 is the distance between the metal bracket projection 35 and the GND harness 31, and L7 is the distance between the metal bracket projection 35 and the signal harness 29. In this example, when the static electricity is charged in the resin housing 5 and the metal bracket 1, because the distance L6 is smaller than the distance L7, the static electricity is discharged in the discharge gap 33 having the distance L6 between the projection 35 and the GND harness 31, and can foe prevented from being discharged by the signal harness 29.

Figure 11:
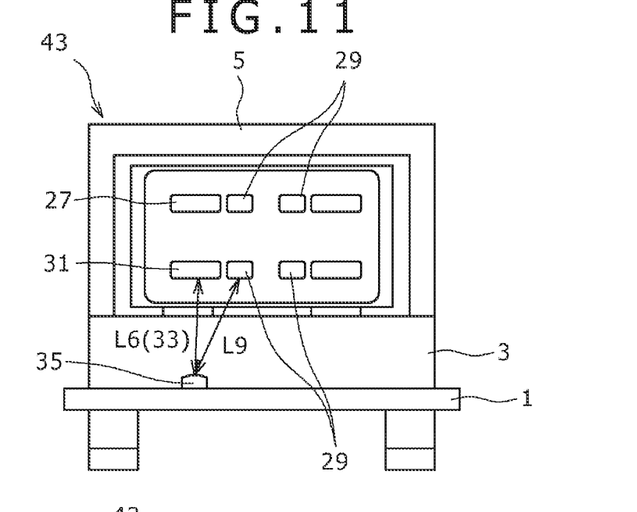
FIG. 11 is a layout diagram illustrating another example of a metal bracket projection and a harness in the in-vehicle electronic device according to the present invention.
Figure 12:
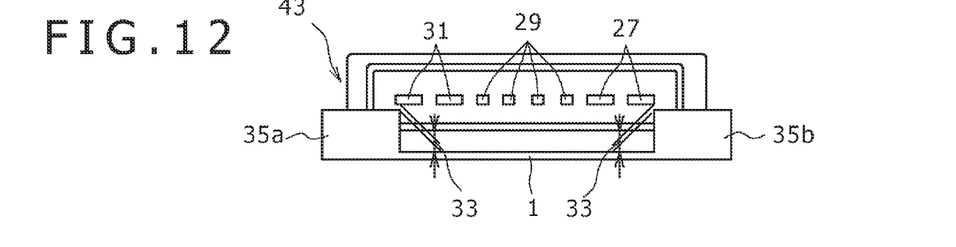
FIG. 12 is a relative position diagram illustrating one example of a metal bracket projection and a harness in the in-vehicle electronic device according to the present invention.
Figure 13:
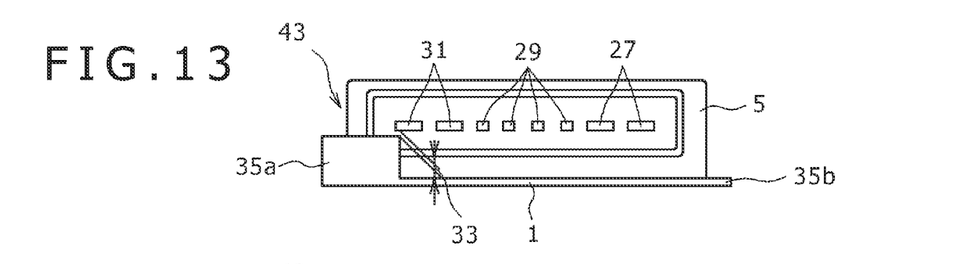
FIG. 13 is a relative position diagram illustrating another example of a metal bracket projection and a harness in the in-vehicle electronic device according to the present invention.
Figure 14:
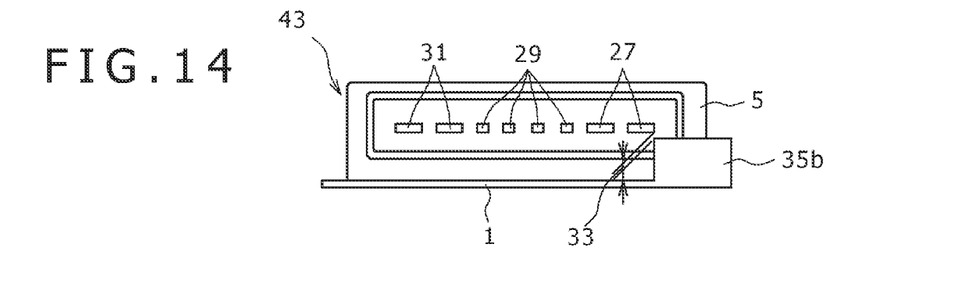
FIG. 14 is a relative position diagram illustrating another example of a metal bracket projection and a harness in the in-vehicle electronic device according to the present invention.

In FIG. 11, as compared with FIG. 9, the positions of the metal bracket projection 35 in a horizontal direction and the vertical direction are set to be different therebetween, but the positional relationship is L8<L9. In this example, L8 is the distance between the metal bracket projection 35 and the GND harness 31, and L9 is the distance between the metal bracket projection 35 and the signal harness 29. In this example, when the static electricity is charged in the resin housing 5 and the metal bracket 1, because the distance L8 is smaller than the distance L9, the static electricity is discharged in the discharge gap 33 having the distance L8 between the projection 35 and the GND harness 31, and can be prevented from being discharged by the signal harness 29.

With the above configuration, in FIGS. 8 to 11, even when the position of the metal bracket projection 35 is different due to an assembly error, because the static electricity is discharged from the metal bracket projection 35 to the GND harness 31 in a range where the distance relationship satisfies the above conditions, the transmission of the high voltage and the large current generated when the static electricity is supplied to the semiconductor element 11 mounted within the in-vehicle electronic device 43 can be prevented.

In FIGS. 12 to 15, the connector terminals are aligned in the horizontal direction. Even in this case, the distance between a metal bracket projection (GND side) 35a and the GHD harness 31 is set to be shorter than the distance between the metal bracket projection (GND side) 35a and the signal harness 29 to form the discharge gap 33. As a result, the transmission of the high voltage and the large current generated when the static electricity is supplied to the semiconductor element 11 mounted within the in-vehicle electronic device 43 can be prevented. The same advantages can be achieved by setting the distance between a metal bracket projection (battery side) 35b and the battery harness 27 to be shorter than the distance between the metal bracket projection (battery side) 35b and the signal harness 29 to form the discharge gap 33.

Figure 15:
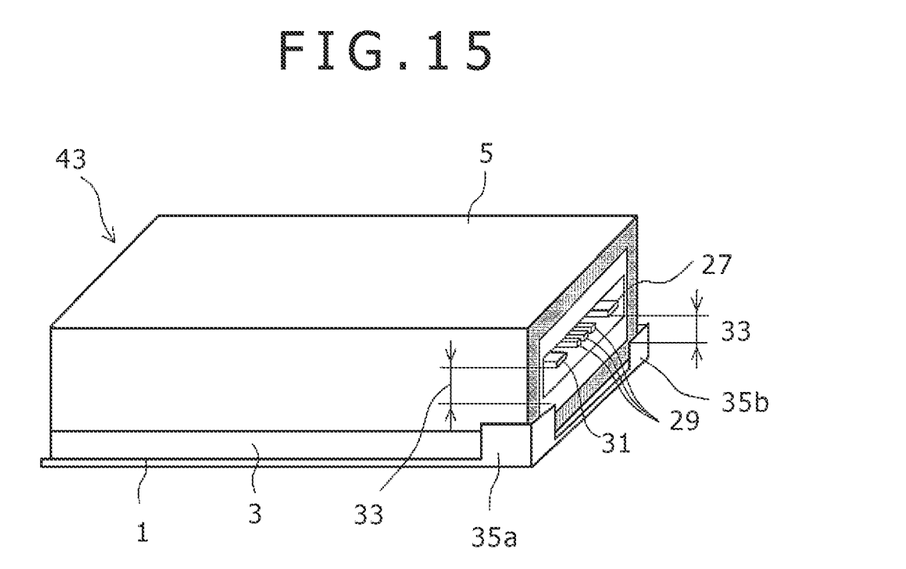
FIG. 15 is a perspective view of the in-vehicle electronic device according to the present invention.

Also, as illustrated in FIG. 15, the metal bracket projection (GND side) 35a and the metal bracket projection (battery side) 35b are formed on corners of the metal bracket 1, and can function as reinforcement of the metal bracket 1. In this embodiment, the distance between the metal bracket projection 35a and the GHD harness 31. is set to be shorter to form the discharge gap 33, and the distance between the metal bracket projection 35b and the battery harness 27 is set to be shorter to form the discharge gap 33. Because the distance to the signal harness 29 is longer, the discharge is generated in a site of the discharge gap 33 shorter in the distance, and the discharge between the signal harness 29 and the vehicle GND can be surely prevented.

The metal bracket 1 described above may be configured as the metal bracket 1, independently. Alternatively, the metal bracket and the projection can be molded in a main body portion of the vehicle, and the metal bracket having the projection can also serve as the vehicle main body. Also, the metal bracket 1 also serves as a bracket of the load device integrated with the in-vehicle electronic device as the metal bracket as a metal structure mechanically holding the load device 49 of the in-vehicle electronic device 43, and the in-vehicle electronic device 43.

The embodiments of the present invention have been described above in detail, but the present invention is not limited to the above embodiments, and the present invention includes various modified examples without departing from the spirit the present invention defined in the claims. For example, in the above-mentioned embodiments, in order to easily understand the present invention, the specific configurations are described. However, the present invention does not always provide all of the configurations described above. Also, a part of one configuration example can be replaced with another configuration example, and the configuration of one embodiment can be added with the configuration of another embodiment. Also, in a part of the respective configuration examples, another configuration can be added, deleted, or replaced.

Also, the control lines and the information lines necessary for description are illustrated, and all of the control lines and the information lines necessary for products are not illustrated. In fact, it may be conceivable that most of the configurations are connected to each other.

Industrial Applicability

As application examples of the present invention, the in-vehicle electronic device can foe fitted to railway vehicles, and can be also applied to intended purposes of various vehicles by being fitted to vehicles other than the railway vehicles.

List of Reference Signs

1 . . . metal bracket
3 . . . resin case (resin housing)
5 . . . resin housing
7 . . . control board
9 . . . capacitor
11 . . . semiconductor element
13 . . . passive element
15 . . . power connector terminal (male)
16 . . . GND connector terminal (male)
17 . . . signal connector terminal (male)
19 . . . signal connector terminal (female)
21 . . . male connector
23 . . . power connector terminal (female)
24 . . . GHD connector terminal (female)
25 . . . female connector
27 . . . battery harness (power wiring)
29 . . . signal harness (input/output signal wiring)
31 . . . GND harness (power wiring)
33 . . . discharge gap
35, 35a, 35b . . . projection
37 . . . static electricity
43 . . . in-vehicle electronic device
45, 47 . . . load connection line
49 . . . load device
53 . . . sensor
55 . . . vehicle battery
57 . . . another electronic device connection line
59 . . . another electronic device
60 . . . vehicle main body
61 . . . vehicle GND

The invention claimed is:

1. An in-vehicle electronic device comprising: a resin housing; a control board that is covered with the housing, and accommodated within the housing; a power wiring that supplies power to the control board; an input/output signal wiring that transmits an input/output signal to the control board; and a metal bracket which fixes the resin housing to a vehicle main body,
   wherein a distance between the metal bracket and the power wiring is set to be shorter than a distance between the metal bracket and the input/output signal wiring to form a discharge gap.

2. The in-vehicle electronic device according to claim 1, wherein the power wiring is connected to a vehicle GND or a vehicle battery (negative electrode).

3. The in-vehicle electronic device according to claim 1, wherein the power wiring is connected to a vehicle battery (positive electrode).

4. The in-vehicle electronic device according to claim 1, wherein the metal bracket has a structure serving as the vehicle main body.

5. The in-vehicle electronic device according to claim 1, wherein the metal bracket has a structure serving as a bracket of a load device integrated with the in-vehicle electronic device.

6. The in-vehicle electronic device according claim 1, wherein the power wiring is connected to the vehicle battery.

* * * * *